US010096585B2

(12) United States Patent
Tanaka et al.

(10) Patent No.: US 10,096,585 B2
(45) Date of Patent: Oct. 9, 2018

(54) METHOD OF MANUFACTURING LIGHT EMITTING ELEMENT AND LIGHT EMITTING DEVICE INCLUDING FORMING RESIN FILM INCLUDING PHOSPHOR CONTAINING LAYER

(71) Applicant: TOYODA GOSEI CO., LTD., Kiyosu-shi (JP)

(72) Inventors: Motoyuki Tanaka, Kiyosu (JP); Yosuke Tsuchiya, Kiyosu (JP); Aya Kawaoka, Kiyosu (JP); Makoto Ishida, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 15/446,968

(22) Filed: Mar. 1, 2017

(65) Prior Publication Data
US 2017/0278834 A1 Sep. 28, 2017

(30) Foreign Application Priority Data

Mar. 22, 2016 (JP) ................... 2016-057610

(51) Int. Cl.
*H01L 33/50* (2010.01)
*H01L 25/00* (2006.01)
(Continued)

(52) U.S. Cl.
CPC .......... *H01L 25/50* (2013.01); *H01L 25/0756* (2013.01); *H01L 33/486* (2013.01);
(Continued)

(58) Field of Classification Search
CPC ...... H01L 33/0079; H01L 24/95–24/97; H01L 2933/0041; H01L 21/78–21/86; H01L 33/50–33/508
See application file for complete search history.

(56) References Cited

U.S. PATENT DOCUMENTS

2008/0179611 A1\* 7/2008 Chitnis ................ H01L 33/508
257/98
2010/0252845 A1 10/2010 Lin et al.
(Continued)

FOREIGN PATENT DOCUMENTS

JP 2002-261325 A 9/2002
JP 2010-245515 A 10/2010
(Continued)

*Primary Examiner* — Stephen Bradley
(74) *Attorney, Agent, or Firm* — McGinn I.P. Law Group, PLLC.

(57) ABSTRACT

A method of manufacturing a light emitting element includes forming a resin film including a phosphor containing layer on a transparent board side surface of a wafer including a transparent board and a plurality of light emitting parts formed on the transparent board, forming a scribing line along a scheduled separation surface in a surface of the transparent board by scribing before or after forming the resin film, cutting the resin film along the scheduled separation surface before or after forming the scribing line, and separating the transparent board along the scheduled separation surface by breaking after forming the scribing line and cutting the resin film.

17 Claims, 4 Drawing Sheets

(51) Int. Cl.
*H01L 33/48* (2010.01)
*H01L 25/075* (2006.01)
(52) U.S. Cl.
CPC .... *H01L 33/507* (2013.01); *H01L 2933/0033* (2013.01); *H01L 2933/0041* (2013.01)

(56) References Cited

U.S. PATENT DOCUMENTS

| | | | | |
|---|---|---|---|---|
| 2010/0327733 | A1* | 12/2010 | Shaikevitch | C09J 7/0296 |
| | | | | 313/501 |
| 2011/0266560 | A1* | 11/2011 | Yao | H01L 33/0079 |
| | | | | 257/88 |
| 2012/0261699 | A1* | 10/2012 | Ooyabu | H01L 33/505 |
| | | | | 257/98 |
| 2013/0256727 | A1* | 10/2013 | Higuchi | H01L 33/44 |
| | | | | 257/98 |
| 2013/0328100 | A1 | 12/2013 | Kono et al. | |
| 2014/0001656 | A1 | 1/2014 | Ebe et al. | |
| 2015/0115278 | A1* | 4/2015 | Ichikawa | H01L 33/22 |
| | | | | 257/76 |
| 2015/0357250 | A1* | 12/2015 | Kim | H01L 33/005 |
| | | | | 438/7 |
| 2017/0133562 | A1* | 5/2017 | Ling | H01L 33/0095 |

FOREIGN PATENT DOCUMENTS

| | | |
|---|---|---|
| JP | 2013-258209 A | 12/2013 |
| JP | 2014-022704 A | 2/2014 |
| JP | 2014-112724 A | 6/2014 |
| JP | 2014-168036 A | 9/2014 |
| JP | 2014-192326 A | 10/2014 |

* cited by examiner

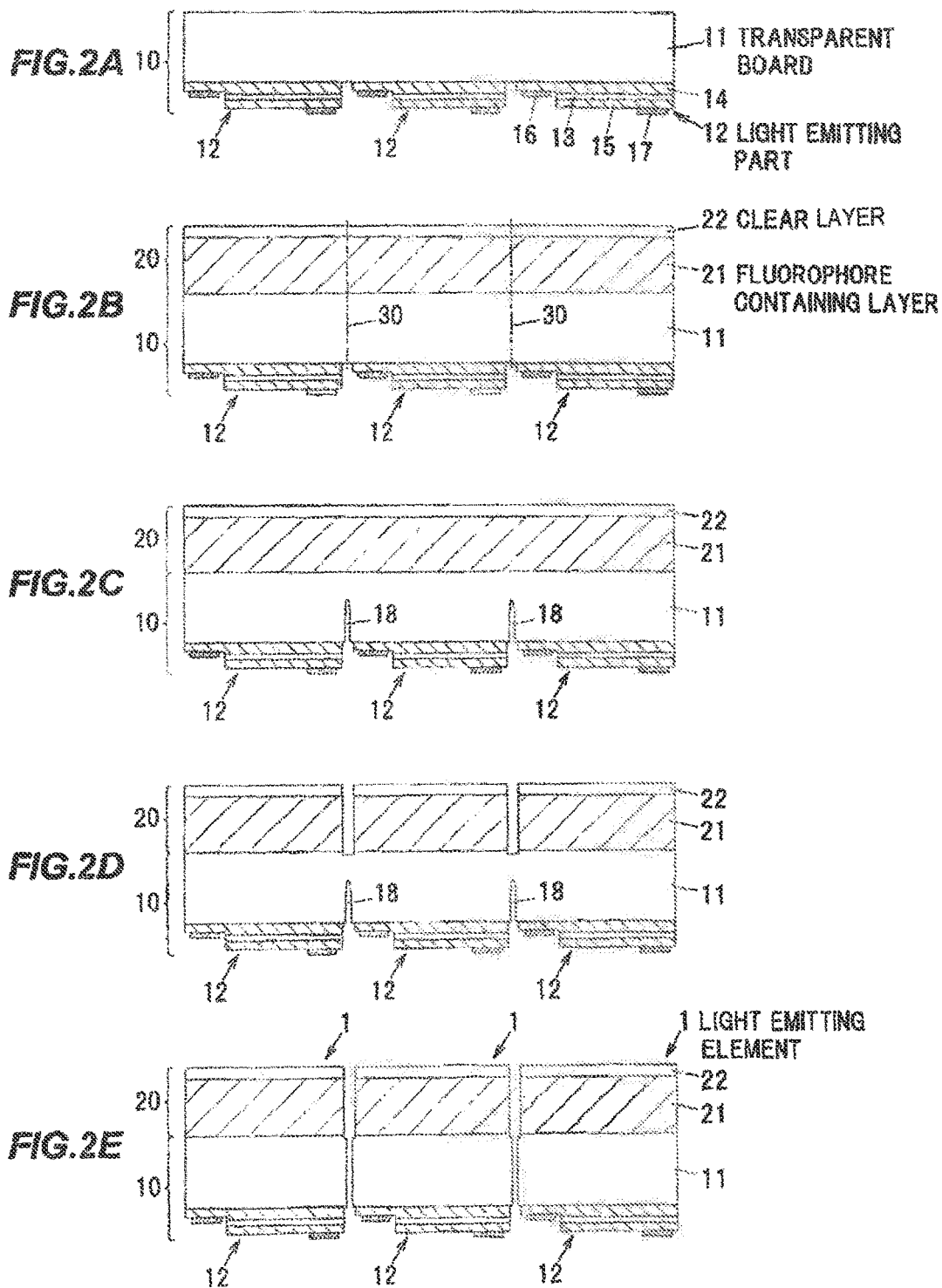

METHOD OF MANUFACTURING LIGHT EMITTING ELEMENT AND LIGHT EMITTING DEVICE INCLUDING FORMING RESIN FILM INCLUDING PHOSPHOR CONTAINING LAYER

The present application is based on Japanese patent application No. 2016-057610 filed on Mar. 22, 2016, the entire contents of which are incorporated herein by reference.

BACKGROUND OF THE INVENTION

1. Field of the Invention

This invention relates to a method of manufacturing a light emitting element and a method of manufacturing a light emitting device using the light emitting element.

2. Description of the Related Art

A method of manufacturing a light emitting device is known in which a resin sheet including a phosphor is put directly or via sealing resin on individual Light Emitting Diode (LED) chips (see e.g. JP-A-2013-258029, JP-A-2014-22704, and JP-A-2014-112724).

Also, a method of manufacturing a light emitting device is known in which plural LED chips are sealed by one phosphor sheet (see e.g. JP-A-2014-192326).

Also, a method of manufacturing a light emitting device is known in which plural LED chips on a supporting sheet are sealed with one phosphor sheet, the phosphor sheet is cut and separated, and then the LED chips covered with the phosphor sheet are peeled from the supporting sheet and disposed on a board (see e.g. JP-A-2014-168036).

Also, a method of manufacturing a light emitting device is known in which a phosphor layer is put on each of plural LED chips on one board, and then the board is separated and diced (see e.g. JP-A-2010-245515).

Also, a method of manufacturing a light emitting device is known in which a resin layer including a phosphor is formed on the bottom surface of the wafer which has plural regions as LED chips, and then the wafer and resin layer is cut so as to be divided into the LED chips (see e.g. JP-A-2002-261325).

SUMMARY OF THE INVENTION

According to the method of manufacturing the light emitting device described in JP-A-2002-261325, the wafer and the resin layer are cut by a scriber. However, as a matter of fact, it is difficult to cut the resin layer by the scriber.

It is an object of the invention to provide a method of manufacturing a light emitting element that offers a low dispersion in emission color between plural light emitting elements and a low manufacturing cost, as well as a method of manufacturing a light emitting device using the light emitting element.

According to an embodiment of the invention, provided are a method of manufacturing a light emitting element as defined by [1] to [4] below and a method of manufacturing a light emitting device as defined by [5] below.

[1] A method of manufacturing a light emitting element, comprising:
forming a resin film including a phosphor containing layer on a transparent board side surface of a wafer comprising a transparent board and a plurality of light emitting parts formed on the transparent board;
forming a scribing line along a scheduled separation surface in a surface of the transparent board by scribing before or after forming the resin film;
cutting the resin film along the scheduled separation surface before or after forming the scribing line; and
separating the transparent board along the scheduled separation surface by breaking after forming the scribing line and cutting the resin film.

[2] The method according to [1], wherein the resin film comprises a clear layer on the phosphor containing layer.

[3] The method according to [2], wherein the clear layer is formed so as to cover a top surface and a side surface of the phosphor containing layer.

[4] The method according to [2] or [3], wherein the clear layer has a refractive index less than the phosphor containing layer.

[5] A method of manufacturing a light emitting device, comprising:
flip-chip mounting the light emitting element manufactured by the method according to any one of [1] to [4] on a board; and
forming a white sidewall that covers a side surface of the flip-chip mounted light emitting element.

Effects of the Invention

According to an embodiment of the invention, a method of manufacturing a light emitting element can be provided that offers a low dispersion in emission color between plural light emitting elements and a low manufacturing cost, as well as a method of manufacturing a light emitting device using the light emitting element.

BRIEF DESCRIPTION OF THE DRAWINGS

Next, the present invention will be explained in conjunction with appended drawings, wherein:

FIG. 2A is a longitudinal sectional view showing the method of manufacturing the light emitting element according to the first embodiment;

FIG. 2B is a longitudinal sectional view showing the method of manufacturing the light emitting element according to the first embodiment;

FIG. 2C is a longitudinal sectional view showing the method of manufacturing the light emitting element according to the first embodiment;

FIG. 2D is a longitudinal sectional view showing the method of manufacturing the light emitting element according to the first embodiment;

FIG. 2E is a longitudinal sectional view showing the method of manufacturing the light emitting element according to the first embodiment;

DETAILED DESCRIPTION OF THE PREFERRED EMBODIMENTS

First Embodiment

Figure 1A:
FIG. 1A is a perspective view schematically showing a method of manufacturing a light emitting element according to the first embodiment.
Figure 1B:
FIG. 1B is a perspective view schematically showing the method of manufacturing the light emitting element according to the first embodiment.
Figure 1C:
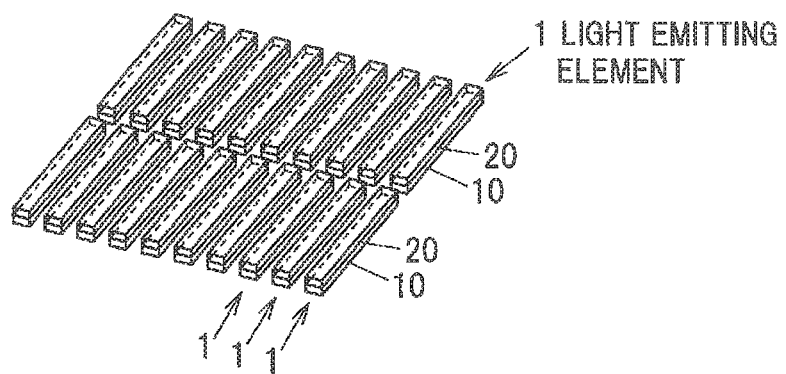
FIG. 1C is a perspective view schematically showing the method of manufacturing the light emitting element according to the first embodiment.

FIGS. 1A to 1C are perspective views schematically showing a method of manufacturing a light emitting element 1 according to the first embodiment.

First, as shown in FIG. 1A, a wafer 10 which includes plural light emitting element structures is prepared.

Next, as shown in FIG. 1B, resin film 20 is coated on a surface of the wafer 10. The resin film 20 is formed by, for example, coating using squeegee, spray coating, or spin coating.

When the resin film 20 is formed by coating using the squeegee, a thickness uniformity can be improved. When the resin film 20 is formed by spin coating, a manufacturing cost can be decreased. When the resin film 20 is formed by spray coating, since the resin film 20 fails to be susceptible from a warp of the wafer 10 and the thin resin film 20 can be formed, wasting material can be reduced.

Next, as shown in FIG. 1C, the wafer 10 and the resin film 20 are cut and separated into the plural light emitting elements 1.

Next, the method of manufacturing the light emitting element 1 will be explained more specifically in conjunction with a partial enlarged cross sectional view.

FIGS. 2A to 2E are longitudinal sectional views showing the method of manufacturing the light emitting element 1 according to the first embodiment.

As shown in FIG. 2A, the wafer 10 includes one transparent board 11 and plural light emitting parts 12 which are formed on the surface of the transparent board 11.

For example, the transparent board 11 is a sapphire board. Typically, the light emitting part 12 is provided with a light emitting layer 13, an N-type cladding layer 14 and a P-type cladding layer 15, which sandwich the light emitting layer 13, and an N-side electrode 16 and a P-side electrode 17, which are connected to the N-type cladding layer 14 and the P-type cladding layer 15 respectively.

As shown in FIG. 2B, the resin film 20 is formed on a transparent board 11 side surface of the wafer 10 (the opposite side surface of the transparent board 11 on which the light emitting part 12 is formed). The resin film 20 includes a phosphor containing layer 21, and may include a clear layer 22. For example, the thickness of the phosphor containing layer 21 and the clear layer 22 are 150 µm, 50 µm respectively. A line 30 shown in FIG. 2B means a positon of a scheduled separation surface.

The phosphor containing layer 21 comprises a transparent layer shaped resin which includes particulate phosphors. For resin configuring the phosphor containing layer 21, transparent resin such as silicon resin or epoxy resin can be used. Phosphor color of the particulate phosphors is not limited thereto. For example, as the yellow particulate phosphor, BOS (Barium orthosilicate) phosphor or YAG (Yttrium aluminum garnet) phosphor is used. For example, when the emission color of the light emitting part 12 is blue and the phosphor color of the phosphor is yellow, the emission color of the light emitting device 1 described below is white. Also, various kinds of phosphors may be mixed.

The clear layer 22 comprises film shaped transparent resin which fails to include the phosphor, and performs as protective film of the phosphor containing layer 21. Although same resin which configures the phosphor containing layer 21 may be used as the resin which configures the clear layer 22, the refractive index of the clear layer 22 is preferable to be less than the refractive index of the resin which configures the phosphor containing layer 21 so as to increase light transmittance from the phosphor containing layer 21 to the clear layer 22. Also, the clear layer 22 may be attached a diffusing agent such as Titanium oxide ($TiO_2$) or a dispersing agent such as Silica ($SiO_2$).

Next, as shown in FIG. 2C, a scribing line is formed on the surface of the transparent board 11 along the scheduled separation surface by laser scribing. The scribing line is an assembly of pits 18 which are arranged in linear, and opening of the pit 18 forms a dot-line on the surface of the transparent board 11.

Meanwhile, forming the scribing line may be carried out before forming the resin film 20 on the surface of the wafer 10.

Next, as shown in FIG. 2D, the resin film 20 is cut along the scheduled separation surface. For cutting the resin film 20, an ultrasonic cutter can be used. In this case, it is preferable to make a cut by a position where the transparent board 11 is cut slightly such that the resin film 20 is cut completely.

Meanwhile, cutting the resin film 20 may be carried out before forming the scribing line.

Next, as shown in FIG. 2E, the transparent board 11 is separated along the scheduled separation surface by breaking, and the plural light emitting elements 1 are obtained. In this case, "Breaking" means separating the board from the scribing line by applying an external force to the board and producing stress such as bending stress or horizontal stress.

Second Embodiment

The second embodiment is different from the first embodiment in forming the clear layer so as to cover side surface of the phosphor containing layer. Furthermore, the explanation of the same as in the first embodiment is omitted or simplified below.

FIGS. 3A to 3E are longitudinal sectional views showing a method of manufacturing a light emitting element 2 according to the second embodiment.

Figure 3A:
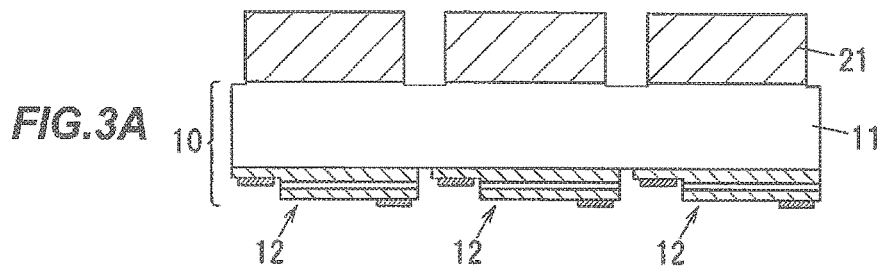
FIG. 3A is a longitudinal sectional view showing a method of manufacturing a light emitting element according to the second embodiment.

First, as shown in FIG. 3A, the phosphor containing layer 21 is cut along the scheduled separation surface after forming the phosphor containing layer 21 on the transparent board 11 side surface of the wafer 10. For cutting the phosphor containing layer 21, the ultrasonic cutter etc. can be used. In this case, it is preferable to make a cut by a position where the transparent board 11 is cut slightly such that t the phosphor containing layer 21 is cut completely.

Figure 3B:
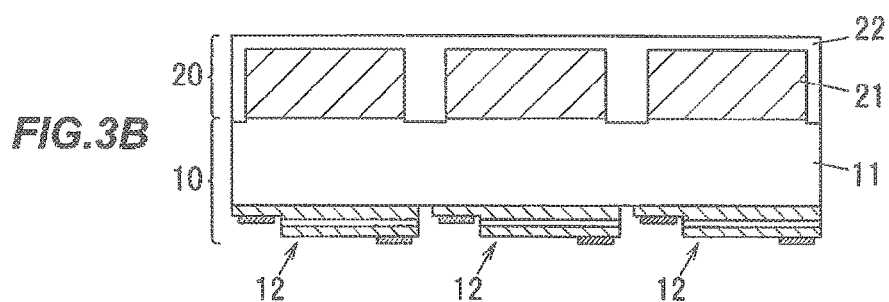
FIG. 3B is a longitudinal sectional view showing the method of manufacturing the light emitting element according to the second embodiment.

Next, as shown in FIG. 3B, the clear layer 22 is formed on the phosphor containing layer 21. Since the phosphor containing layer 21 is cut before forming the clear layer 22, not only the top surface, but also the side surface of the phosphor containing layer 21 are covered with the clear layer 22.

Figure 3C:
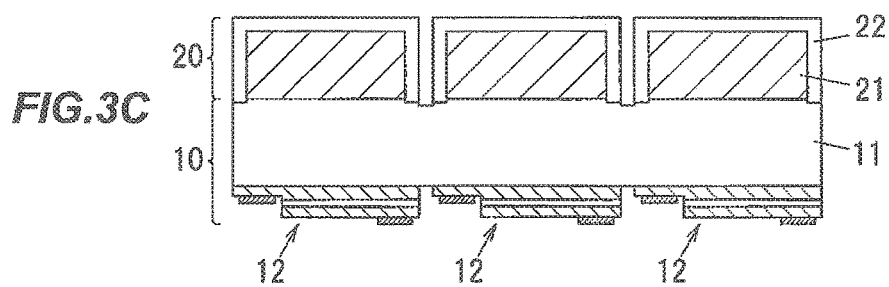
FIG. 3C is a longitudinal sectional view showing the method of manufacturing the light emitting element according to the second embodiment.

Next, as shown in FIG. 3C, the clear layer 22 is cut along the scheduled separation surface. For cutting the clear layer 22, the ultrasonic cutter etc. can be used. In this case, it is preferable to make a cut by a position where the transparent board 11 is cut slightly such that the clear layer 22 is cut completely. And, for leaving the clear layer 22 which covers the side surface of the phosphor containing layer 21, a cutting width of the clear layer 22 is narrower than the cutting width of the phosphor containing layer 21 shown in FIG. 3A.

Figure 3D:
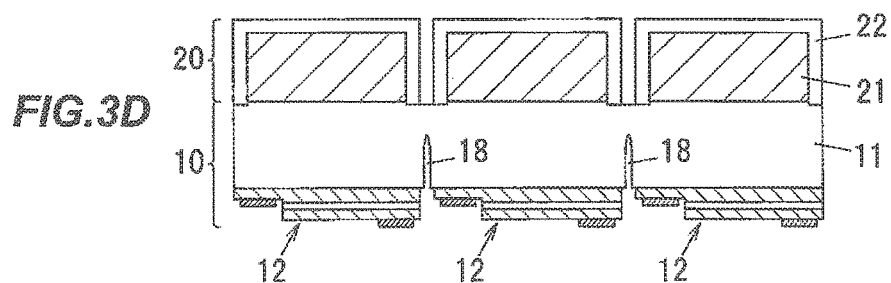
FIG. 3D is a longitudinal sectional view showing the method of manufacturing the light emitting element according to the second embodiment.

Next, as shown in FIG. 3D, a scribing line is formed on the surface of the transparent board 11 along the scheduled separation surface by laser scribing. Accordingly, forming the scribing line can be carried out in optional timing before forming the phosphor containing layer 21 and after cutting the clear layer 22.

Figure 3E:
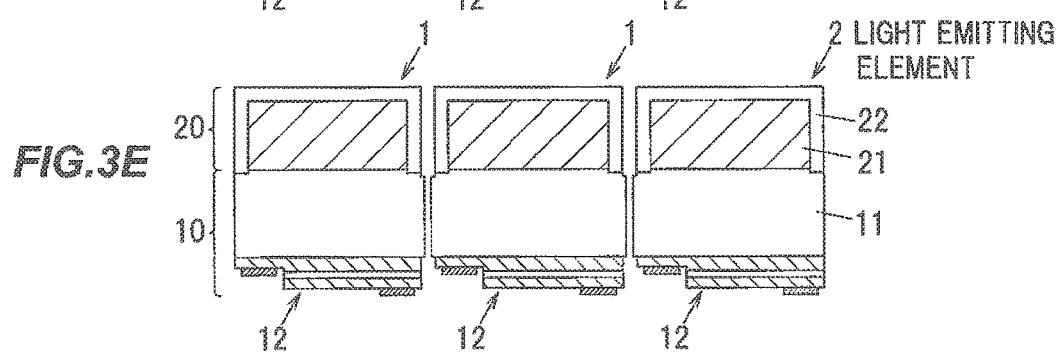
FIG. 3E is a longitudinal sectional view showing the method of manufacturing the light emitting element according to the second embodiment.

Next, as shown in FIG. 3E, the transparent board 11 is separated along the scheduled separation surface by breaking, the plural light emitting elements 2 are obtained.

Third Embodiment

The third embodiment is an embodiment of the light emitting device which is provided with the light emitting element according to the first and second embodiments. Furthermore, the explanation of the same as in the first and second embodiments is omitted or simplified below.

Figure 4A:
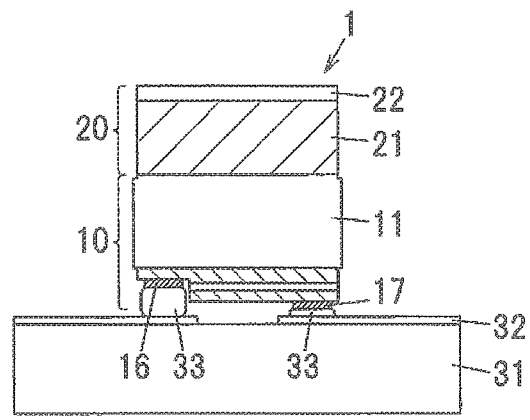
FIG. 4A is a longitudinal sectional view showing a method of manufacturing a light emitting device according to the third embodiment.
Figure 4B:
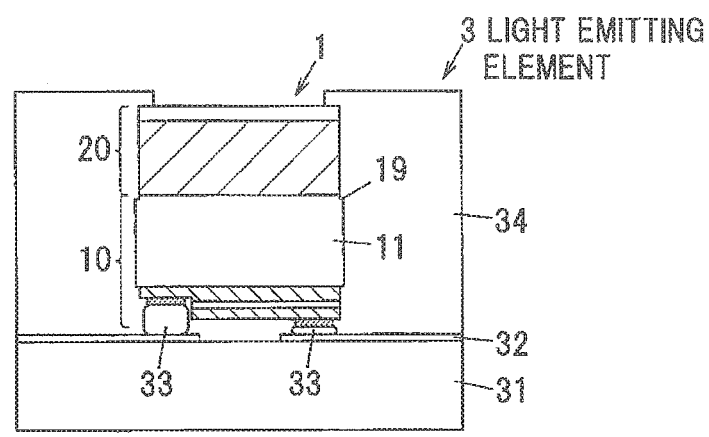
FIG. 4B is a longitudinal sectional view showing the method of manufacturing the light emitting device according to the third embodiment.

FIGS. 4A, 4B are longitudinal sectional views showing a method of manufacturing a light emitting device 3 according to the third embodiment.

First, as shown in FIG. 4A, the light emitting element 1 is flip-chip mounted on a board 31. The board 31 is, for example, a circuit board which comprises a circuit 32 on the surface of the board 31. And the N-side electrode 16 and the P-side electrode 17 of the light emitting element 1 are connected electrically to the circuit 32 through solder balls 33. Meanwhile, the board 31 may be a lead circuit frame inserted board.

Next, as shown in FIG. 4B, a white sidewall 34 is formed so as to cover the side surface of the light emitting element 1. The white side wall 34 comprises, for example, resin such as the silicone resin or the epoxy resin which contains white color such as Titanium oxide. A height of the top surface of the side wall 34 may be higher than a height of the top surface of the clear layer 22 or may be equal to the height of the top surface of the clear layer 22.

Since the side surface of the light emitting device 3 is covered by the sidewall 34 which reflects the light, the light emitting device 3 has high directivity. Also, the transparent board 11 of the light emitting element 1 is provided with an uneven 19 which is exposed at a position nearby an interfacial surface between the phosphor containing layer 21 caused by the method of manufacturing. Since the uneven 19 makes an anchor effect, adhesion between the light emitting element 1 and the sidewall 34 is improved.

Meanwhile, in the example shown in FIGS. 4A, 4B, although the light emitting element 1 according to the first embodiment is used, the light emitting element 2 according to the second embodiment may be used instead of the light emitting element 1.

(Functions and Advantageous Effects of the Embodiments)

According to the light emitting device in the above embodiments, since the phosphor containing layers which are included in the plural light emitting elements is formed collectively, a dispersion of the emission color between plural light emitting elements is low. And the manufacturing cost can be reduced since using an adhesive agent so as to adhere the phosphor containing layer with each of diced light emitting elements is not needed.

Although the embodiments have been described, the invention is not intended to be limited to the embodiments. The various kinds of modifications can be implemented without departing from the gist of the invention. For example, the scribing line may be formed by cutting.

Also, the claimed invention is not intended to be limited to the embodiments. Further, it should be noted that all combinations of the features described in the embodiments and the Examples are not necessary to solve the problems of the invention.

What is claimed is:

1. A method of manufacturing a light emitting element, the method comprising:
   forming a resin film including a phosphor containing layer on a transparent board side surface of a wafer comprising a transparent board and a plurality of light emitting parts formed on the transparent board;
   forming a scribing line along a scheduled separation surface in a surface of the transparent board by scribing before or after forming the resin film;
   cutting the resin film along the scheduled separation surface before or after forming the scribing line such that, after the cutting of the resin film, a portion of the transparent board remains along the scheduled separation surface; and
   separating the transparent board along the scheduled separation surface by breaking the remaining portion of the transparent board after forming the scribing line and cutting the resin film.

2. The method according to claim 1, wherein the resin film comprises a clear layer on the phosphor containing layer.

3. The method according to claim 2, wherein the clear layer is formed so as to cover a top surface and a side surface of the phosphor containing layer.

4. The method according to claim 2, wherein the clear layer has a refractive index less than that of the phosphor containing layer.

5. A method of manufacturing a light emitting device, the method comprising:
   flip-chip mounting the light emitting element manufactured by the method according to claim 1 on a board; and
   forming a white sidewall that covers a side surface of the flip-chip mounted light emitting element.

6. The method according to claim 3, wherein the clear layer has a refractive index less than that of the phosphor containing layer.

7. A method of manufacturing a light emitting device, the m hod comprising:
   flip-chip mounting the light emitting element manufactured by the method according to claim 2 on a board; and
   forming a white sidewall that covers a side surface of the flip-chip mounted light emitting element.

8. A method of manufacturing a light emitting device, the method comprising:
   flip-chip mounting the light emitting element manufactured by the method according to claim 3 on a board; and
   forming a white sidewall that covers a side surface of the flip-chip mounted light emitting element.

9. A method of manufacturing a light emitting device, the method comprising:
   flip-chip mounting the light emitting element manufactured by the method according to claim 4 on a board; and
   forming a white sidewall that covers a side surface of the flip-chip mounted light emitting element.

10. A method of manufacturing a light emitting device, the method comprising:
   flip-chip mounting the light emitting element manufactured by the method according to claim 6 on a board; and
   forming a white sidewall that covers a side surface of the flip-chip mounted light emitting element.

11. A method of manufacturing a light emitting element, the method comprising:
   forming a resin film including a phosphor containing layer on a transparent board side surface of a wafer comprising a transparent board and a plurality of light emitting parts formed on the transparent board;
   forming a scribing line along a scheduled separation surface in a surface of the transparent board by scribing before or after forming the resin film;
   cutting the resin film along the scheduled separation surface before forming the scribing line such that, after the cutting of the resin film, a portion of the transparent board remains along the scheduled separation surface; and
   separating the transparent board along the scheduled separation surface by breaking the remaining portion of the transparent board after forming the scribing line and cutting the resin film.

12. A method of manufacturing a light emitting element, the method comprising:
   forming a resin film including a phosphor containing layer on a transparent board side surface of a wafer comprising a transparent board and a plurality of light emitting parts formed on the transparent board;
   forming a scribing line along a scheduled separation surface in a surface of the transparent board by scribing before or after forming the resin film;
   cutting the resin film along the scheduled separation surface before or after forming the scribing line such that, after the cutting of the resin film, a portion of the transparent board remains along the scheduled separation surface; and
   separating the transparent board along the scheduled separation surface by breaking the remaining portion of the transparent board after forming the scribing line and cutting the resin film; and
   forming a white sidewall that covers a side surface of the flip-chip mounted light emitting element.

13. The method according to claim 12, wherein the resin film comprises a clear layer on the phosphor containing layer.

14. The method according to claim 13, wherein the clear layer is formed so as to cover a top surface and a side surface of the phosphor containing layer.

15. The method according to claim 13, wherein the clear layer has a refractive index less than that of the phosphor containing layer.

16. A method of manufacturing a light emitting device, the method comprising:
   flip-chip mounting the light emitting element manufactured by the method according to claim 12 on a board; and
   forming the white sidewall that covers the side surface of the flip-chip mounted light emitting element.

17. The method according to claim 14, wherein the clear layer has a refractive index less than that of the phosphor containing layer.

* * * * *